(12) United States Patent
Kameda et al.

(10) Patent No.: US 8,741,783 B2
(45) Date of Patent: Jun. 3, 2014

(54) CLEANING METHOD, METHOD OF MANUFACTURING SEMICONDUCTOR DEVICE, SUBSTRATE PROCESSING APPARATUS AND RECORDING MEDIUM

(75) Inventors: Kenji Kameda, Toyama (JP); Yuji Urano, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 13/616,872

(22) Filed: Sep. 14, 2012

(65) Prior Publication Data
US 2013/0065402 A1 Mar. 14, 2013

(30) Foreign Application Priority Data

Sep. 14, 2011 (JP) ................................. 2011-200293
Jul. 5, 2012 (JP) ................................. 2012-151396

(51) Int. Cl.
*H01L 21/31* (2006.01)
*H01L 21/469* (2006.01)

(52) U.S. Cl.
USPC ........... 438/758; 438/658; 438/686; 438/694; 257/E21.159; 257/E21.211

(58) Field of Classification Search
USPC ............. 438/658–694, 758–778; 118/15–724; 257/E21.159; 134/22, 105
See application file for complete search history.

(56) References Cited

U.S. PATENT DOCUMENTS

| 6,290,779 B1 | 9/2001 | Saleh et al. |
| 2005/0082002 A1 | 4/2005 | Sato et al. |
| 2006/0068598 A1 | 3/2006 | Okada et al. |
| 2007/0248767 A1* | 10/2007 | Okura et al. .................. 427/534 |
| 2009/0149032 A1 | 6/2009 | Kameda et al. |
| 2009/0170328 A1* | 7/2009 | Kameda et al. ............... 438/694 |

FOREIGN PATENT DOCUMENTS

| JP | 2005-101583 A | 4/2005 |
| JP | 2005-277302 A | 10/2005 |
| JP | 2005-317920 A | 11/2005 |
| JP | 2009-231794 A | 10/2009 |
| JP | 2010-171458 | 8/2010 |
| KR | 10-0739354 | 7/2007 |

* cited by examiner

*Primary Examiner* — Charles Garber
*Assistant Examiner* — Abdulfattah Mustapha
(74) *Attorney, Agent, or Firm* — Volpe And Koenig, P.C.

(57) ABSTRACT

A method of cleaning an inside of a processing chamber is provided according to an embodiment of the present disclosure. The method includes supplying a fluorine-based gas and a nitrogen oxide-based gas as the cleaning gas, into the processing chamber heated to a first temperature, and removing a deposit by a thermochemical reaction. The method further includes changing a temperature in the processing chamber to a second temperature higher than the first temperature, and supplying the fluorine-based gas and the nitrogen oxide-based gas as the cleaning gas, and removing extraneous materials, remaining on the surface of the member in the processing chamber, by a thermochemical reaction.

17 Claims, 5 Drawing Sheets

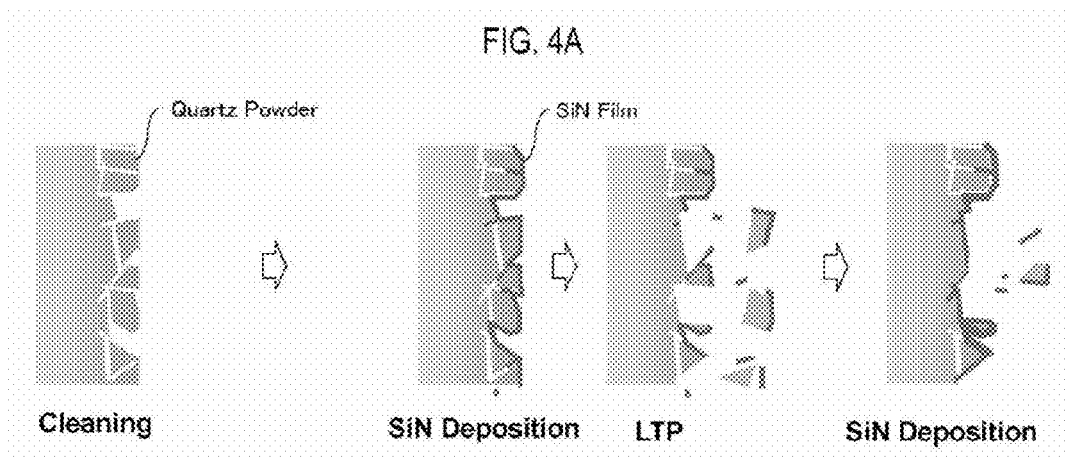
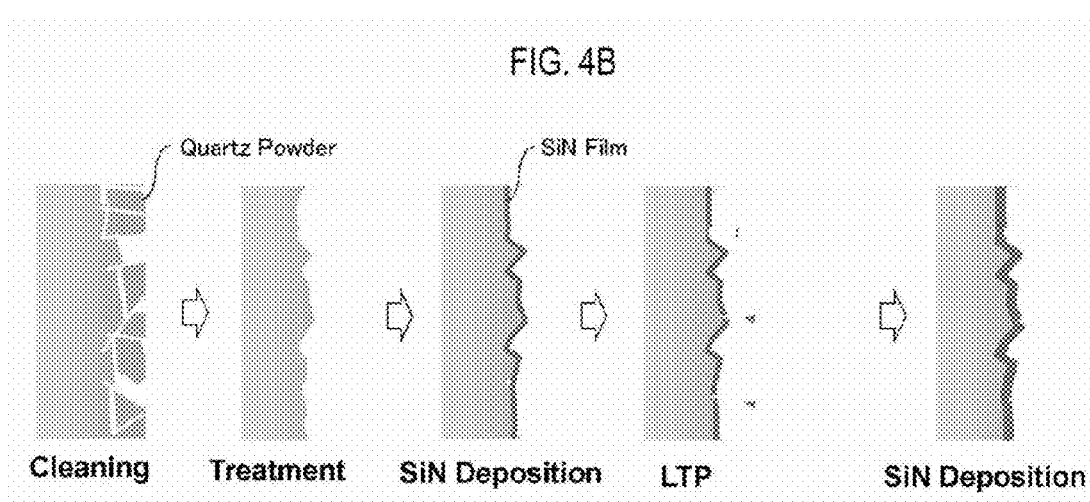

CLEANING METHOD, METHOD OF MANUFACTURING SEMICONDUCTOR DEVICE, SUBSTRATE PROCESSING APPARATUS AND RECORDING MEDIUM

CROSS-REFERENCE TO RELATED APPLICATIONS

This application is based upon and claims the benefit of priority from Japanese Patent Application Nos. 2011-200293, filed on Sep. 14, 2011, and 2012-151396, filed on Jul. 5, 2012, the entire contents of which are incorporated herein by reference.

TECHNICAL FIELD

The present disclosure relates to a cleaning method, a method of manufacturing a semiconductor device, a substrate processing apparatus and a recording medium.

BACKGROUND

As one method of manufacturing a semiconductor device, a process of supplying a cleaning gas into a processing chamber and cleaning the inside of the processing chamber is performed after a process of forming a thin film on a substrate is performed in the inside of the processing chamber. In the related art, there is known a cleaning method including an etching process of unilaterally supplying a fluorine gas or a fluorine gas diluted with an inert gas as a cleaning gas into a processing chamber heated to a first temperature and removing a thin film deposited inside of the processing chamber, and a treatment process of removing extraneous materials remaining in the inside of the processing chamber after the thin film is removed.

However, in the etching process of unilaterally supplying the fluorine gas or the fluorine gas diluted with the inert gas as the cleaning gas into the processing chamber and removing the thin film deposited in the inside of the processing chamber, particularly in a low-temperature condition of less than 400, the time required to remove the thin film is lengthened. Depending on conditions, the etching selection ratio of the thin film to quartz ($SiO_2$) may be lowered, and a quartz member constituting the processing chamber may receive an uneven etching damage.

SUMMARY

The present disclosure provides some embodiments of a cleaning method, a method of manufacturing a semiconductor device, a substrate processing apparatus and a recording medium, in which when a thin film deposited in the inside of a processing chamber is removed, it is possible to reduce the time required to remove the thin film and to prevent a quartz member constituting the processing chamber from receiving an uneven etching damage.

According to one embodiment of the present disclosure, there is provided a method of cleaning an inside of a processing chamber by supplying a cleaning gas into the processing chamber after performing a process of forming a thin film on a substrate in the processing chamber, the method including: supplying a fluorine-based gas and a nitrogen oxide-based gas or a fluorine-based gas and a nitrogen oxide-based gas diluted with an inert gas, as the cleaning gas, into the processing chamber heated to a first temperature, and removing a deposit, including the thin film deposited on a surface of a member in the processing chamber, by a thermochemical reaction; changing a temperature in the processing chamber to a second temperature higher than the first temperature; and supplying the fluorine-based gas and the nitrogen oxide-based gas or the fluorine-based gas and the nitrogen oxide-based gas diluted with the inert gas, as the cleaning gas, into the processing chamber heated to the second temperature, and removing extraneous materials, remaining on the surface of the member in the processing chamber after removing the deposit including the thin film by a thermochemical reaction.

According to another embodiment of the present disclosure, there is provided a method of manufacturing a semiconductor device, the method including: loading a substrate into a processing chamber; performing a process of forming a thin film on the substrate by supplying a processing gas into the processing chamber; unloading the substrate on which the process has been completed from the inside of the processing chamber; and cleaning the inside of the processing chamber by supplying a cleaning gas into the processing chamber, with the substrate unloaded from the inside of the processing chamber, wherein the cleaning of the inside of the processing chamber includes supplying a fluorine-based gas and a nitrogen oxide-based gas or a fluorine-based gas and a nitrogen oxide-based gas diluted with an inert gas, as the cleaning gas, into the processing chamber heated to a first temperature, and removing a deposit, including the thin film, deposited on a surface of a member in the processing chamber, by a thermochemical reaction; changing a temperature in the processing chamber to a second temperature higher than the first temperature; and supplying the fluorine-based gas and the nitrogen oxide-based gas or the fluorine-based gas and the nitrogen oxide-based gas diluted with the inert gas, as the cleaning gas, into the processing chamber heated to the second temperature, and removing extraneous materials, remaining on the surface of the member in the processing chamber after removing the deposit including the thin film by a thermochemical reaction.

According to still another embodiment of the present disclosure, there is provided a substrate processing apparatus, including: a processing chamber in which a thin film is formed on a substrate; a processing gas supply system configured to supply a processing gas into the processing chamber; a cleaning gas supply system configured to supply a cleaning gas into the processing chamber; a heater configured to heat an inside of the processing chamber; and a controller configured to control the heater, the processing gas supply system and the cleaning gas supply system when cleaning the inside of the processing chamber by supplying the cleaning gas into the processing chamber after performing the process of forming the thin film on the substrate by supplying the processing gas into the processing chamber, so as to perform a process of supplying a fluorine-base gas and a nitrogen oxide-based gas or a fluorine-based gas and a nitrogen oxide-based gas diluted with an inert gas, as the cleaning gas, into the processing chamber heated to a first temperature, and removing a deposit, including the thin film, deposited on a surface of a member in the processing chamber, by a thermochemical reaction, a process of changing the temperature in the processing chamber to a second temperature higher than the first temperature, and a process of supplying the fluorine-based gas and the nitrogen-oxide-based gas or the fluorine-based gas and the nitrogen oxide-based gas diluted with the inert gas, as the cleaning gas, into the processing chamber heated to the second temperature, and removing extraneous materials, remaining on the surface of the member in the processing chamber after removing the deposit including the thin film by a thermochemical reaction.

According to yet another embodiment of the present disclosure, there is provided a non-transitory computer-readable recording medium storing a program that causes a computer to perform a process of cleaning an inside of a processing chamber by supplying a cleaning gas into the processing chamber after performing a process of forming a thin film on a substrate in the processing chamber, wherein the process of cleaning includes supplying a fluorine-based gas and a nitrogen oxide-based gas or a fluorine-based gas and a nitrogen oxide-based gas diluted with an inert gas, as the cleaning gas, into the processing chamber heated to a first temperature, and removing a deposit, including the thin film, deposited on a surface of a member in the processing chamber, by a thermochemical reaction; changing a temperature in the processing chamber to a second temperature higher than the first temperature; and supplying the fluorine-based gas and the nitrogen oxide-based gas or the fluorine-based gas and the nitrogen oxide-based gas diluted with the inert gas, as the cleaning gas, into the processing chamber heated to the second temperature, and removing extraneous materials, remaining on the surface of the member in the processing chamber after removing the deposit including the thin film by a thermochemical reaction.

BRIEF DESCRIPTION OF THE DRAWINGS

FIG. 4A is a schematic diagram illustrating a change on a surface of a quartz after a treatment process is not performed after an etching process of a thin film, and FIG. 4B is a schematic diagram illustrating a change on a surface of a quartz after a treatment process has been performed after an etching process of a thin film.

DETAILED DESCRIPTION

An embodiment of the present disclosure will now be described in detail with reference to the drawings.

(1) Configuration of Substrate Processing Apparatus

Figure 1:
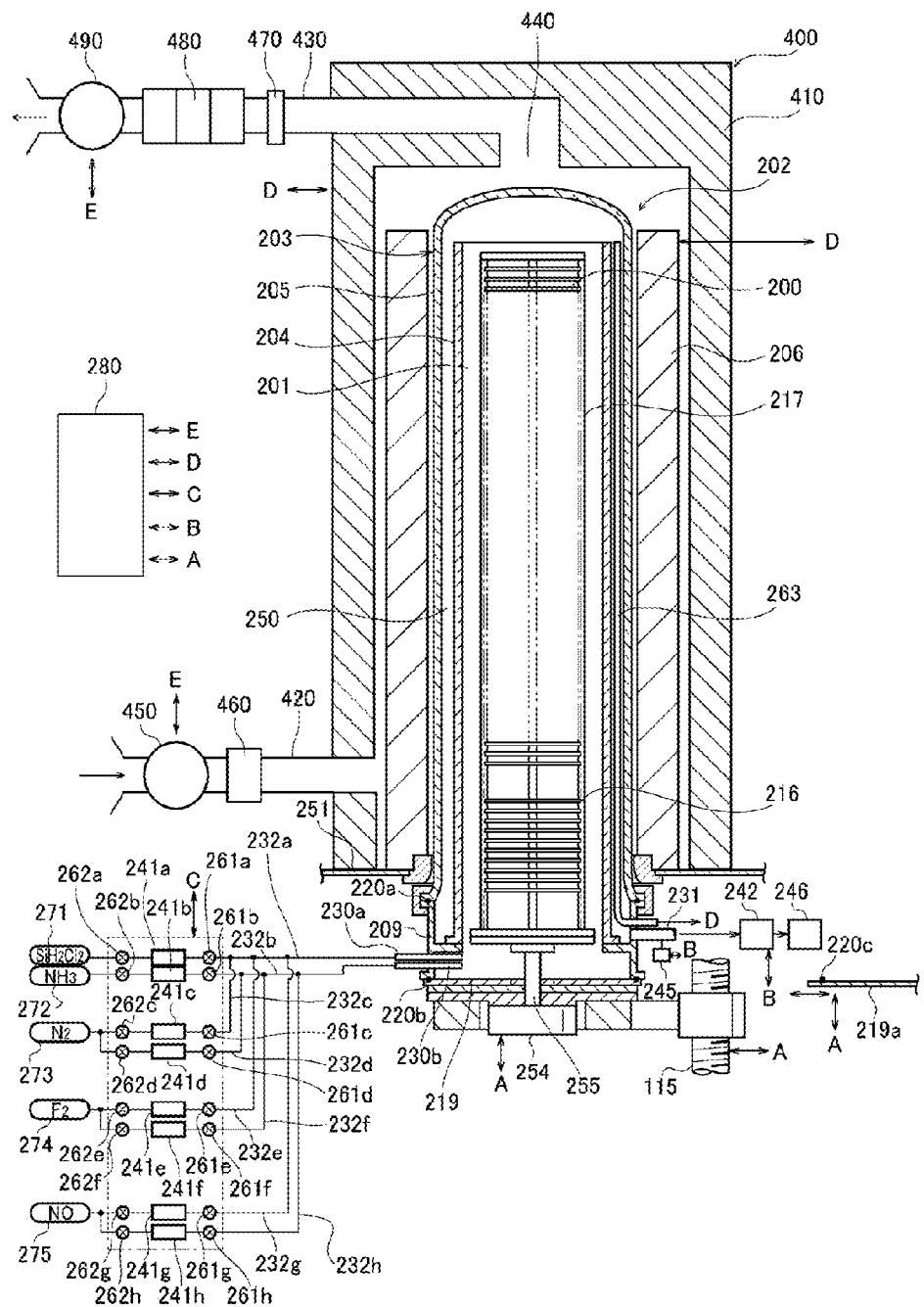
FIG. 1 is a schematic configuration diagram of a processing furnace in a substrate processing apparatus according to an embodiment of the present disclosure.

First, the configuration of a substrate processing apparatus according to an embodiment of the present disclosure will now be described with reference to the drawings. FIG. 1 is a schematic configuration diagram of a processing furnace 202 of the substrate processing apparatus shown in a longitudinal sectional view according to an embodiment of the present disclosure.

As shown in FIG. 1, the processing furnace 202 has a heater 206 as a heating mechanism. The heater 206 has a cylindrical shape, and is vertically mounted on a heater base 251 as a retainer support plate by being supported by the heater base 251.

A process tube 203 as a reaction tube is concentrically formed inside of the heater 206. The process tube 203 includes an inner tube 204 as an internal reaction tube and an outer tube 205 as an external reaction tube mounted on the outside of the inner tube 204. The inner tube 204 is made of a heat-resistant material, for example, including quartz ($SiO_2$), silicon carbide (SiC), etc. The inner tube 204 is shaped as a cylinder with its top and bottom ends opened. A processing chamber 201, in which a process of forming a thin film on a wafer 200 as a substrate is performed, is formed at a hollow portion of the inner tube 204. The processing chamber 201 may be configured to accommodate wafers 200 so that the wafers 200 positioned in the horizontal direction are vertically arranged in a multistage structure by a boat 217, which will be described later. The outer tube 205 is made of a heat-resistant material (e.g., quartz, silicon carbide, etc.), and the internal diameter of the outer tube 205 is greater than the external diameter of the inner tube 204. The outer tube 205 is shaped as a cylinder with its top end closed and its bottom end opened. The inner tube 204 and the outer tube 205 are configured to be concentric to each other.

A manifold 209 is formed below the outer tube 205 in a concentric manner with the outer tube 205. The manifold 209 is made of, for example, stainless steel, and is shaped as a cylinder with its top and bottom ends opened. The manifold 209 is coupled to the inner and outer tubes 204 and 205 so as to support the inner and outer tubes 204 and 205. An O-ring 220a as a seal member is mounted between the manifold 209 and the outer tube 205. The manifold 209 is supported by the heater base 251, so that the process tube 203 is vertically mounted. A reaction container is formed by the process tube 203 and the manifold 209.

Nozzles 230a and 230b as gas inlet portions are connected to the manifold 209 so as to communicate with the inside of the processing chamber 201. Processing gas supply pipes 232a and 232b for supplying a processing gas used to form a thin film into the processing chamber 301 are connected to the nozzles 230a and 230b, respectively. A $SiH_2Cl_2$ (DCS) gas supply source 271 as a first processing gas supply source is connected to an upstream side of the processing gas supply pipe 232a through a mass flow controller (MFC) 241a as a gas flow rate controller. The $SiH_2Cl_2$ (DCS) gas supply source 271 is located opposite to a side of the processing gas supply pipe 232a connected to the nozzle 230a. Valves 262a and 261a are mounted at upstream and downstream sides of the MFC 241a in the processing gas supply pipe 232a, respectively. A $NH_3$ gas supply source 272 as a second processing gas supply source is connected to an upstream side of the processing gas supply pipe 232b through an MFC 241b as a gas flow rate controller. The $NH_3$ gas supply source 272 is located opposite to a side of the processing gas supply pipe 232b connected to the nozzle 230b. Valves 262b and 261b are mounted at upstream and downstream sides of the MFC 241b in the processing gas supply pipe 232b, respectively.

A processing gas supply system is mainly configured with the processing gas supply pipes 232a and 232b, the MFCs 241a and 241b, and the valves 262a, 261a, 262b and 261b. The processing gas supply system may include the $SiH_2Cl_2$ gas supply source 271 and the $NH_3$ gas supply source 272.

Inert gas supply pipes 232c and 232d are connected to downstream sides of the valves 261a and 261b in the processing gas supply pipes 232a and 232b, respectively. A $N_2$ gas supply source 273 as an inert gas supply source for supplying, for example, a nitrogen ($N_2$) gas as an inert gas is connected to an upstream side of the inert gas supply pipe 232c through an MFC 241c as a gas flow rate controller. The $N_2$ gas supply source 273 which is located opposite to a side of the inert gas supply pipe 232c connected to the processing gas supply pipe 232a. Valves 262c and 261c are mounted at upstream and downstream sides of the MFC 241c in the inert gas supply pipe 232c, respectively. The N₂ gas supply source 273 described above is connected to an upstream side of the inert gas supply pipe 232d through an MFC 241d as a gas flow rate controller. Precisely, the upstream side of the inert gas supply pipe 232d is connected to an upstream side of the valve 262c in the inert gas supply pipe 232c. The N₂ gas supply source 273 is also located opposite to a side of the inert gas supply pipe 232d connected to the processing gas supply pipe 232b. That is, the inert gas supply pipe 232d is mounted to be branched from the inert gas supply pipe 232c at an upstream side of the valve 262c. Valves 262d and 261d are mounted at upstream and downstream sides of the MFC 241d in the inert gas supply pipe 232d, respectively.

An inert gas supply system is mainly configured with the inert gas supply pipes 232c and 232d, the MFCs 241c and 241d, and the valves 262c, 261c, 262d and 261d. The inert gas supply system may include the N₂ gas supply source 273. The inert gas supply system functions to dilute a processing or cleaning gas, and may be configured as a part of the processing gas supply system or a part of a cleaning gas supply system. The inert gas supply system also functions as a purge gas supply system.

Cleaning gas supply pipes 232e, 232f, 232g and 232h for supplying a cleaning gas for cleaning the inside of the processing chamber 201 into the processing chamber 201 are connected to both downstream sides of the valves 261a and 261b in the processing gas supply pipes 232a, and 231b and downstream sides of the processing gas supply pipes 232a and 231b connected with the inert gas supply pipes 232c and 232d, respectively.

A F₂ gas supply source 274 as a cleaning gas supply source for supplying, for example, a fluorine (F₂) gas as a fluorine-based gas is connected to an upstream side of the cleaning gas supply pipe 232e through an MFC 241e as a gas flow rate controller. The F₂ gas supply source 274 is located opposite to a side of the cleaning gas supply pipe 232e connected to the processing gas supply pipe 232a. Valves 262e and 261e are mounted at upstream and downstream sides of the MFC 241e in the cleaning gas supply pipe 232e, respectively. The F₂ gas supply source 274 described above is connected to an upstream side of the cleaning gas supply pipe 232f through an MFC 241f as a gas flow rate controller. The F₂ gas supply source 274 is also located opposite to a side of the cleaning gas supply pipe 232f connected to the processing gas supply pipe 232b. Specifically, the upstream side of the cleaning gas supply pipe 232f is connected to an upstream side of the valve 262e in the cleaning gas supply pipe 232e. That is, the cleaning gas supply pipe 232f is mounted to be branched from the cleaning gas supply pipe 232e at an upstream side of the valve 262e. Valves 262f and 261f are mounted at upstream and downstream sides of the MFC 241f in the cleaning gas supply pipe 232f, respectively.

A NO gas supply source 275 as a cleaning gas supply source for supplying, for example, a nitrogen monoxide (NO) gas as a nitric oxide-based gas is connected to an upstream side of the cleaning gas supply pipe 232g through an MFC 241g as a gas flow rate controller. The NO gas supply source 275 is located opposite to a side of the cleaning gas supply pipe 232g connected to the processing gas supply pipe 232a. Valves 262g and 261g are mounted at upstream and downstream sides of the MFC 241g in the cleaning gas supply pipe 232g, respectively. The NO gas supply source 275 described above is connected to an upstream side of the cleaning gas supply pipe 232h through an MFC 241h as a gas flow rate controller. The NO gas supply source 275 is also located opposite to a connection side of the cleaning gas supply pipe 232h connected to the processing gas supply pipe 323b. Precisely, the upstream side of the cleaning gas supply pipe 232h is connected to an upstream side of the valve 262g in the cleaning gas supply pipe 232g. That is, the cleaning gas supply pipe 232h is mounted to be branched from the cleaning gas supply pipe 232g at an upstream side of the valve 262g. Valves 262h and 261h are mounted at upstream and downstream sides of the MFC 241h in the cleaning gas supply pipe 232h, respectively.

The cleaning gas supply system is mainly configured with the cleaning gas supply pipes 232e, 232f, 232g and 232h, the MFCs 241e, 241f, 241g and 241h, and the valves 262e, 261e, 262f, 261f, 262g, 261g, 262h and 261h. The cleaning gas supply system may include the F₂ gas supply source 274 and the NO gas supply source 275.

A controller 280 described later is connected to the MFCs 241a, 241b, 241c, 241d, 241e, 241f, 241g and 241h, and the valves 261a, 261b, 261c, 261d, 261f, 261g, 261h, 262a, 262b, 262c, 262d, 262e, 262f, 262g and 262h. The controller 280 is configured to control the MFCs 241a, 241b, 241c, 241d, 241e, 241f, 241g and 241h, and the valves 261a, 261b, 261c, 261d, 261f, 261g, 261h, 262a, 262b, 262c, 262d, 262e, 262f, 262g and 262h at a predetermined timing so that the kind of gas supplied into the processing chamber 201 at each step according to the embodiments of the present disclosure becomes a predetermined kind of gas, the flow rate of the supplied gas becomes a predetermined flow rate, and the concentration of the supplied gas becomes a predetermined concentration.

An exhaust pipe 231 for exhausting an atmosphere in the processing chamber 201 is mounted on the manifold 209. The exhaust pipe 231 is disposed in a lower end portion of a tubular space 250 formed by the gap between the inner and outer tubes 204 and 205, and the exhaust pipe 231 and the tubular space 250 communicate with each other. A vacuum exhaust device 246 such as a vacuum pump is connected to a downstream side of the exhaust pipe 231 through a pressure sensor 245 as a pressure detector and a pressure regulator 242 such as a variable conductance valve, e.g., an auto pressure controller (APC). The vacuum exhaust device 246 is located opposite to a side of the exhaust pipe 231 connected to the manifold 209. The vacuum exhaust device 246 is configured to perform a vacuum exhaust for the pressure in the processing chamber 201 to reach a predetermined pressure (degree of vacuum). The controller 280, as will be described later in detail, is connected to the vacuum exhaust device 246, the pressure regulator 242 and the pressure sensor 245. The controller 280 is configured to control the pressure regulator 242 at a predetermined timing, based on pressure information detected by the pressure sensor 245, for the pressure in the processing chamber 201 to reach a predetermined pressure. An exhaust system is mainly configured with the exhaust pipe 231, the pressure sensor 245 and the pressure regulator 242. The exhaust system may include the vacuum exhaust device 246.

A seal cap 219 as a first furnace port cover that can airtightly close a bottom opening of the manifold 209 is mounted at a lower side of the manifold 209. The seal cap 219 comes in contact with the bottom end of the manifold 209 from a vertical lower side of the manifold 209. The seal cap 219 is made of, for example, metal such as stainless steel, and is formed in a disk shape. An O-ring 220b as a seal member that comes in contact with the bottom end of the manifold 209 is mounted on a top surface of the seal cap 219. A rotation mechanism 254 for rotating the boat 217 is mounted at a bottom side of the seal cap 219, which is opposite to the processing chamber 201. A rotary shaft 255 of the rotation mechanism 254 is connected to the boat 217 through the seal cap 219, and is configured to allow the wafer 200 to be rotated by rotating the boat 217. The seal cap 219 is configured to be lifted/lowered in the vertical direction by a boat elevator 115 as a lifting/lowering mechanism vertically mounted at the outside of the process tube 203. Accordingly, the boat 217 can be carried into/out of the processing chamber 201. That is, the boat elevator 115 is configured as a carrier device (carrier mechanism) for carrying the boat 217, i.e. the wafer 200 into/out of the processing chamber 201. The controller 280 is connected to the rotation mechanism 254 and the boat elevator 115. The controller 280 is configured to control the rotation mechanism 254 and the boat elevator 115 at a predetermined timing so that the rotation mechanism 254 and the boat elevator 115 perform a predetermined operation. A furnace port shutter 219a as a second furnace port cover that can airtightly close a bottom opening of the manifold 209 is mounted at the lower side of the manifold 209. The shutter 219a is lifted and rotated to come in contact with the bottom end of the manifold 209 after the boat 217 is carried out from the inside of the processing chamber 201. The inside of the processing chamber 201 is airtightly closed after the boat 217 is carried out from the inside of the processing chamber 201. An O-ring 220c as a seal member that comes in contact with the bottom end of the manifold 209 is mounted on a top surface of the shutter 219a.

The boat 217 as a substrate retainer support mechanism is made of, for example, a heat-resistant material such as quartz or silicon carbide, and is configured to maintain the plurality of wafers 200 in a multistage structure in which the wafers 200 are positioned in the horizontal direction and the centers of the wafer 200 are aligned with one another. A plurality sheets of heat insulating plates 216 as disk-shaped heat insulating members made of a heat-resistant material such as quartz and silicon carbide are positioned in the horizontal direction to be arranged in a multistage structure, and are configured so that it is difficult to conduct heat from the heater 206 toward the manifold 209.

A temperature sensor 263 as a temperature detector is mounted in the process tube 203. The controller 280 is connected to the heater 206 and the temperature sensor 263. The controller 280 is configured to control a power-supplying state to the heater 206 based on temperature information detected by the temperature sensor 263, so that the temperature in the processing chamber 201 reaches a predetermined temperature.

A forced cooling mechanism (rapid cooling mechanism) 400 is mounted to cover the process tube 203 and the heater 206. The forced cooling mechanism 400 includes a heat insulating cover 410 to cover the process tube 203 and the heater 206, a supply line 420 to communicate with an internal space of the heat insulating cover 410, and an exhaust line 430 to communicate with the internal space of the heat insulating cover 410 through an exhaust hole 440 of a ceiling portion of the heat insulating cover 410. An exhaust blower 490 and a shutter 460 are mounted on the supply line 420. A shutter 470, a radiator 480 and an exhaust blower 490 are mounted on the exhaust line 430. The controller 280 is connected to the forced cooling mechanism 400. The controller 280 is configured to control the forced cooling mechanism 400 at a predetermined timing and to forcibly cool the inside of the processing chamber 201. When the temperature in the processing chamber 201 is dropped by forcibly cooling the inside of the processing chamber 201, the forced cooling mechanism 400 is configured to open the shutters 460 and 470, exhaust a high-temperature atmospheric gas in the heat insulating cover 410 by the exhaust blower 490, and introduce a gaseous cooling medium such as air or $N_2$ into the heat insulating cover 410 by an introductory blower 450. In this case, the gaseous cooling medium is widely spread on the entire external surface of the process tube 203, and directly comes in contact with the entire external surface. When the atmospheric gas in the heat insulating cover 410 is exhausted by operating the exhaust blower 490, the external air may be supplied into the heat insulating cover 410 without operating the introductory blower 450. In this case, the air acts as the gaseous cooling medium. Therefore, the introductory blower 450 may be omitted.

Figure 2:
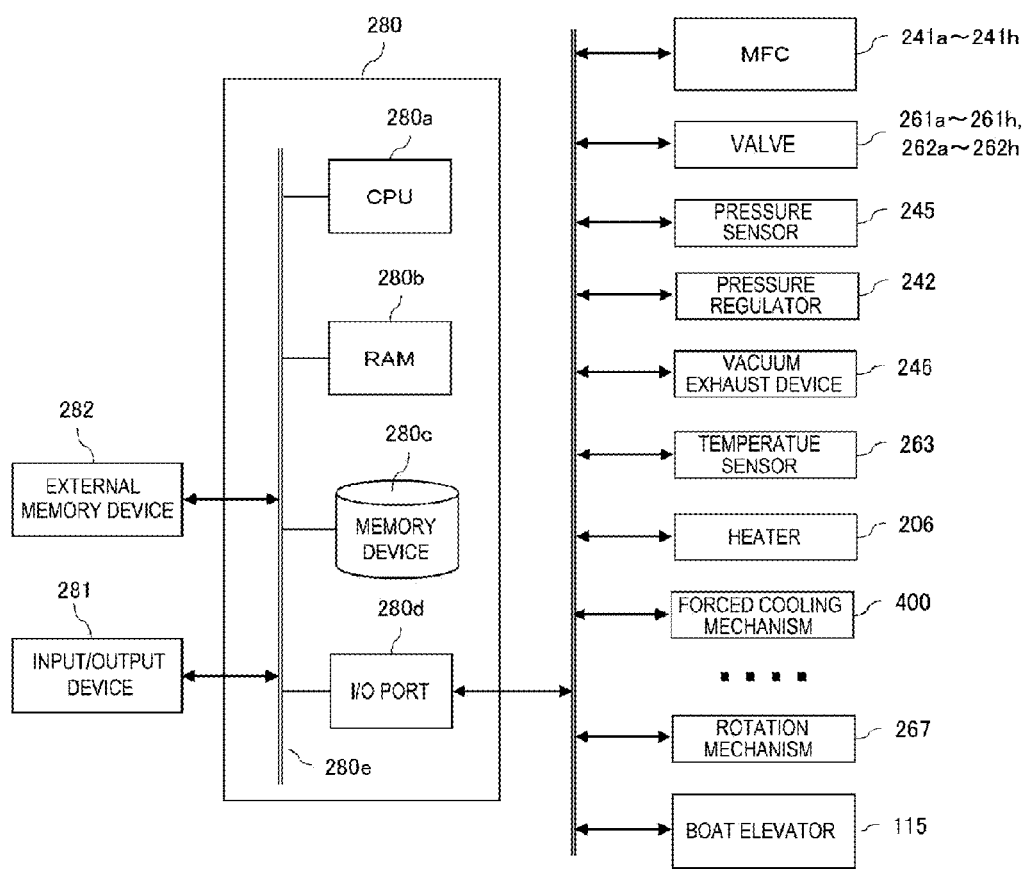
FIG. 2 is a schematic configuration diagram of a controller in the substrate processing apparatus according to an embodiment of the present disclosure.

As shown in FIG. 2, the controller 280 which acts as a control unit (control means) is configured with a computer including a central processing unit (CPU) 280a, a random access memory (RAM) 280b, a memory device 280c and an input/output (I/O) port 280d. The RAM 280b, the memory device 280c and the I/O port 280d are configured to exchange data with the CPU 280a through an internal bus 280e. An I/O device 281 configured with, for example, a touch panel, etc. is connected to the controller 280.

The memory device 280c is configured with, for example, a flash memory, a hard disk drive (HDD), etc. A control program for controlling the operation of the substrate processing apparatus, a process recipe, which includes sequences or conditions for the substrate processing, and a cleaning recipe, which includes sequences or conditions of cleaning processing, are readably stored in the memory device 280c. The process recipe and the cleaning recipe will be described in detail below. The process recipe acting as a program is provided to allow the controller 280 to perform each sequence in a substrate processing process, which will be described later, and to obtain a predetermined result. The cleaning recipe acting as a program is provided to allow the controller 280 to perform each sequence in a cleaning process, which will be described later, and to obtain a predetermined result. Hereinafter, the process recipe, the cleaning recipe and the control program are generally referred to as programs. The case where the term "program" is used in this specification, may include a case where the program includes only a process recipe group, a case where the program includes only a cleaning recipe group, a case where the program includes only a control program group, or a case where the program includes a combination of the process recipe, the cleaning recipe and the control program. The RAM 280b is configured as a memory area (work area) in which a program, data, etc. read by the CPU 280a is temporarily retained.

The I/O port 280d is connected to the MFCs 241a, 241b, 241c, 241d, 241e, 241f, 241g and 241h, the valves 261a, 261b, 261c, 261d, 261f, 261g, 261h, 262a, 262b, 262c, 262d, 262e, 262f, 262g and 262h, the pressure sensor 245, the pressure regulator 242, the vacuum exhaust device 246, the temperature sensor 263, the heater 206, the forced cooling mechanism 400, the rotation mechanism 254, and the boat elevator 115.

The CPU 280a is configured to execute the control program read from the memory device 280c and to read the process recipe or the cleaning recipe from the memory device 280c according to the input of an operation command from the I/O device 281. According to contents of the process recipe or the cleaning recipe read from the memory device 280c, the CPU 280a is configured to control gas flow rate regulations performed by the MFCs 241a, 241b, 241c, 241d, 241e, 241f, 241g and 241h, opening/closing operations of the valves 261a, 261b, 261c, 261d, 261e, 261f, 261g, 261h, 262a, 262b, 262c, 262d, 262e, 262f, 262g and 262h, a pressure monitoring performed by the pressure sensor 245, an opening/closing operation of the pressure regulator 242, a pressure regulating operation performed by the pressure regulator 242 based on the pressure sensor 245, a start and stop operation of the vacuum exhaust device 246, a temperature regulating operation of the heater 206 based on the temperature sensor 263, a forcible cooling in the processing chamber 201 performed by the forced cooling mechanism 400, a rotation and rotation velocity regulation of the boat 217 performed by the rotation mechanism 254, and a lifting operation of the boat 217 performed by the boat elevator 115.

Although the controller 280 is described as a dedicated computer in this embodiment, it may be a general-purpose computer. For example, the controller 280 according to this embodiment may install the program to the general-purpose computer using an external memory device 282 (e.g., magnetic tape, magnetic disk such as flexible disk or hard disk, optical disk such as CD or DVD, optical magnetic disk such as MO, or semiconductor memory such as USB memory or memory card) that stores the program described above. The program may be provided to a computer through the external memory device 282, however, it is not limited hereto. For example, the program may be provided to the computer using a communication means such as Internet or a dedicated line without using the external memory device. The memory device 280c or the external memory device 282 may be a non-transitory computer-readable recording medium. Hereinafter, these memory devices are generally referred to as a recording media. The case where the term "recording medium" is used in this specification may include a case where the recording medium includes only a group of memory device 280c, a case where the recording medium includes only a group of external memory devices 282 or a case where the recording medium includes a group of both memory devices and external memory devices.

(2) Thin Film Forming Method

Next, a method of forming a thin film on each wafer 200 in the processing chamber 201 by a chemical vapor deposition (CVD) technique will be described as one process for manufacturing a semiconductor device using the processing furnace 202 according to the configuration described above. In the following description, the operation of each component constituting the substrate processing apparatus is controlled by the controller 280.

If a plurality of sheets of wafers 200 are loaded (wafer-charged) into the boat 217, the boat 217 retaining the plurality of sheets of wafers 200, as shown in FIG. 1, is lifted by the boat elevator 115 and then carried (boat-loaded) into the processing chamber 201. In this state, the seal cap 219 seals the bottom end of the manifold 209 through the O-ring 220b.

The inside of the processing chamber 201 is vacuum-exhausted by the vacuum exhaust device 246 so that the pressure in the processing chamber 201 becomes a predetermined pressure (degree of vacuum). In this case, the pressure in the processing chamber 201 is measured by the pressure sensor 245, and the pressure regulator 242 is feedback-controlled based on information of the measured pressure (pressure regulation). The vacuum exhaust device 246 always maintains a continuous operation state until at least the processing of the wafers 200 is completed. The inside of the processing chamber 201 is heated by the heater 206 for the temperature in the processing chamber 201 to reach a predetermined temperature. In this case, a power-supplying state to the heater 206 is feedback-controlled based on temperature information detected by the temperature sensor 263, so that the temperature in the processing chamber 201 becomes a predetermined temperature distribution (temperature regulation). The inside of the processing chamber 201 is continuously heated by the heater 206 until at least the processing of the wafers 200 is completed. Subsequently, the rotation mechanism 254 starts rotating the boat 217 and the wafers 200, and the boat 217 and the wafers 200 are continuously rotated until at least the processing of the wafers 200 is completed.

Next, a $SiH_2Cl_2$ gas as a first processing gas and a $NH_3$ gas as a second processing gas are supplied into the processing chamber 201 from the $SiH_2Cl_2$ gas supply source 271 as a first processing gas supply source and the $NH_3$ gas supply source 272 as a second processing gas supply source and the temperature and the pressure in the processing chamber 201 are maintained at a predetermined temperature and a predetermined pressure, respectively. When the valves 262a, 261a, 262b and 261b are opened, so that the $SiH_2Cl_2$ and $NH_3$ gases supplied into the processing gas supply pipes 232a and 232b from the $SiH_2Cl_2$ and $NH_3$ gas supply sources 271 and 272 are controlled to have predetermined flow rates in the MFCs 241a and 241b, pass through the processing gas supply pipes 232a and 232b, and are then introduced into the processing chamber 201 through the nozzles 230a and 230b, respectively.

Simultaneously, a $N_2$ gas may be supplied into the processing chamber 201 from the $N_2$ gas supply source 273 as an inert gas supply source to dilute the processing gases ($SiH_2Cl_2$ and $NH_3$ gases). For example, when the valves 262c, 261c, 262d and 261d are opened, the $N_2$ gas supplied into the inert gas supply pipes 232c and 232d from the $N_2$ gas supply source 273 are controlled to have predetermined flow rates in the MFCs 241c and 241d, pass through the inert gas supply pipes 232c and 232d, and are then introduced through the nozzles 230a and 230b into the processing chamber 201 via the processing gas supply pipes 232a and 232b, respectively. The $N_2$ gas is mixed with the $SiH_2Cl_2$ gas and the $NH_3$ gas in the processing gas supply pipes 232a and 232b, respectively. The concentration of the processing gas may be controlled by controlling the supply flow rate of the $N_2$ gas.

The processing gas introduced into the processing chamber 201 rises in the processing chamber 201, and flows into the tubular space 250 from the top opening of the inner tube 204. Then, the processing gas flows down in the tubular space 250, and is exhausted from the exhaust pipe 231. The processing gas comes in contact with the surface of the wafer 200 when passing through the processing chamber 201. In this case, a thin film, i.e., a nitride silicon ($Si_3N_4$) film, is deposited on the surface of the wafer 200 by a thermal CVD reaction.

After a predetermined processing time, the supply of the processing gas is stopped. That is, the valves 262a, 261a, 262b and 261b are closed to stop supplying the $SiH_2Cl_2$ gas and the $NH_3$ gas into the processing chamber 201 from the $SiH_2Cl_2$ gas supply source 271 and the $NH_3$ gas supply source 272. Then, the valves 262c, 261c, 262d and 261d are opened to supply the $N_2$ gas into the processing chamber 201 from the $N_2$ gas supply source 273, and the $N_2$ gas is exhausted from the exhaust pipe 231 to purge the inside of the processing chamber 201. Thus, the inside of the processing chamber 201 is replaced with the $N_2$ gas to restore the pressure in the processing chamber 201 to an atmospheric pressure.

Then, the seal cap 219 is lowered by the boat elevator 115 to open the bottom end of the manifold 209 and carry out (boat-unload) the processing-completed wafer 200 to the outside of the process tube 203 from the bottom end of the manifold 209 simultaneously when the wafers 200 are retained in the boat 217. Then, the processing-completed wafer 200 is discharged from the boat 217 (wafer discharge).

When the wafer 200 is processed in the processing furnace 202 of this embodiment, for example, when the nitride silicon film is formed, the processing conditions are as follows:

Processing temperature: 650 to 800 degrees C.,
Processing temperature: 10 to 500 Pa, Supply flow rate of $SiH_2Cl_2$ gas: 100 to 500 sccm, and
Supply flow rate of $NH_3$ gas: 500 to 5000 sccm.

Each processing condition is constantly maintained at a certain value in each range, so that processing is performed on the wafer 200.

(3) Cleaning Method

Next, a method of cleaning the inside of the processing chamber 201 will be described. If the thin film forming process is repeated, a thin film such as a silicon nitride film is also accumulated on surfaces of members in the processing chamber 201, such as an inner wall of the process tube 203. That is, a deposit including the thin film is adhered to the inner wall. The processing chamber 201 is cleaned when the thickness of the deposit (the accumulated thin film) adhered to the inner wall reaches a predetermined thickness.

The cleaning is implemented by performing an etching process of the thin film which includes supplying a fluorine-based gas and a nitrogen oxide-based gas or a fluorine-based gas and a nitrogen oxide-based gas diluted with an inert gas as the cleaning gas into the processing chamber 201, which is heated to a first temperature, and removing the thin film deposited (accumulated) on a surface of a member in the processing chamber 201 by a thermochemical reaction (a first step), and a treatment process which includes supplying the fluorine-based gas and the nitrogen oxide-based gas or the fluorine-based gas and the nitrogen oxide-based gas diluted with the inert gas as the cleaning gas into the processing chamber 201, which is heated to a second temperature higher than the first temperature, and removing extraneous materials remaining on the surface of the member in the processing chamber 201 after the thin film is removed (a second step).

Figure 3:
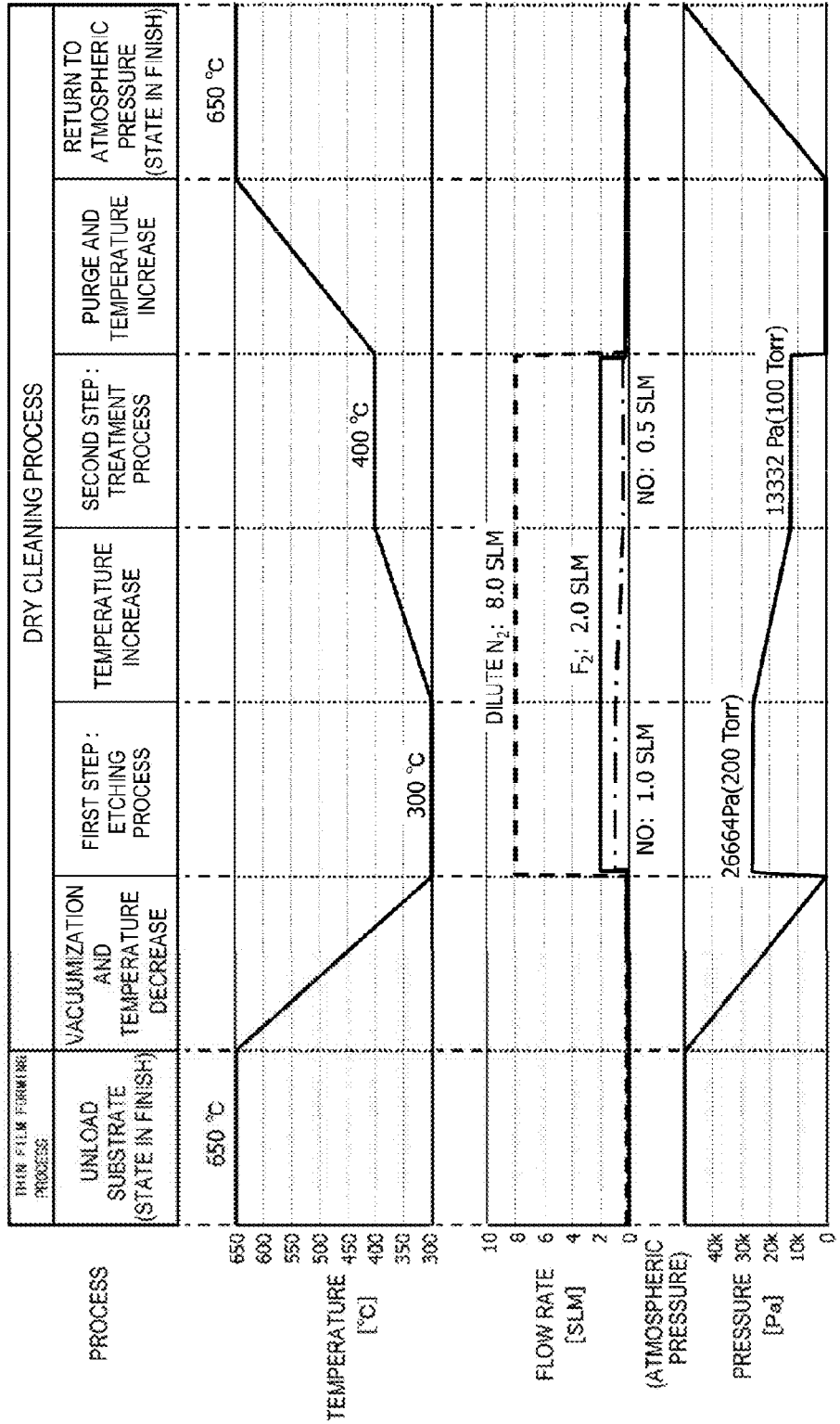
FIG. 3 is a graph illustrating cleaning sequences and cleaning conditions in a cleaning process according to an embodiment of the present disclosure.

Hereinafter, a method of cleaning the inside of the processing chamber 201 using a fluorine ($F_2$) gas as the fluorine-based gas, a nitrogen monoxide (NO) gas as the nitrogen oxide-based gas, and a nitrogen ($N_2$) gas as the inert gas will be described with reference to FIG. 3. FIG. 3 is a graph illustrating cleaning sequences and cleaning conditions according to some embodiments of the present disclosure. In the following description, the operation of each component constituting the substrate processing apparatus is controlled by the controller 280.

[First Step (Etching Process of Thin Film)]

The boat 217 having no wafer 200 is lifted upward by the boat elevator 115 and then carried (boat-loaded) into the processing chamber 201. In this state, the seal cap 219 seals the bottom end of the manifold 209 through the O-ring 220b.

The inside of the processing chamber 201 is vacuum-exhausted by the vacuum exhaust device 246 to reach a predetermined pressure (degree of vacuum), i.e., a first pressure. In this case, the pressure in the processing chamber 201 is measured by the pressure sensor 245, and the pressure regulator 242 is feedback-controlled based on information of the measured pressure (pressure regulation). The vacuum exhaust device 246 always maintains an operation state until at least the cleaning process in the processing chamber 201 is completed, i.e., until the first and second steps are completed. The inside of the processing chamber 201 is heated by the heater 206 to reach a predetermined temperature, i.e., a first temperature. In this case, a power-supplying state to the heater 206 is feedback-controlled based on temperature information detected by the temperature sensor 263, so that the temperature in the processing chamber 201 reaches a predetermined temperature distribution (temperature regulation). The inside of the processing chamber 201 is continuously heated by the heater 206 until at least the cleaning process in the processing chamber 201 is completed. If the pressure and the temperature in the processing chamber 201 reach the first pressure and the first temperature, respectively, the pressure and the temperature are controlled to be maintained until the first step is completed. Subsequently, the rotation mechanism 254 starts rotating the boat 217, and the rotation of the boat 217 is continuously performed until at least the cleaning process in the processing chamber 201 is completed. Alternatively, the boat 217 may not be rotated.

Next, a $F_2$ gas and a NO gas as cleaning gases are supplied into the processing chamber 201 from the $F_2$ gas supply source 274 and the NO gas supply source 275 as cleaning gas supply sources when the temperature and the pressure in the processing chamber 201 are maintained at the first temperature and the first pressure, respectively. When the valves 262e, 261e, 262f and 261f, 262g, 261g, 262h and 261h are opened, the $F_2$ and NO gases supplied into the cleaning gas supply pipes 232e, 232f, 232g and 232h from the $F_2$ and NO gas supply sources 274 and 275 are controlled to have predetermined flow rates in the MFCs 241e, 241f, 241g and 241h, pass through the processing gas supply pipes 232a and 232b, and are then introduced into the processing chamber 201 through the nozzles 230a and 230b, respectively.

Simultaneously, a $N_2$ gas may be supplied into the processing chamber 201 from the $N_2$ gas supply source 273 as an inert gas supply source, and may dilute the $F_2$ and NO gases that are the cleaning gases. For example, when the valves 262c, 261c, 262d and 261d are opened, the $N_2$ gas supplied into the inert gas supply pipes 232c and 232d from the $N_2$ gas supply source 273 are controlled to have predetermined flow rates in the MFCs 241c and 241d, pass through the inert gas supply pipes 232c and 232d, and are then introduced through the nozzles 230a and 230b into the processing chamber 201 via the processing gas supply pipes 232a and 232b, respectively. The $N_2$ gas is mixed with the $F_2$ and NO gases in the processing gas supply pipes 232a and 232b, respectively. The concentration of the $F_2$ gas may be controlled by controlling the supply flow rate of the $N_2$ gas.

The $F_2$ and NO gases or the diluted $F_2$ and NO gases, introduced into the processing chamber 201, rise in the processing chamber 201, and flows into the tubular space 250 from the top opening of the inner tube 204. Then, the $F_2$ and NO gases or the diluted $F_2$ and NO gases flow down in the tubular space 250, and are exhausted from the exhaust pipe 231. The $F_2$ and NO gases or the diluted $F_2$ and NO gases come in contact with the deposit including a thin film such as a silicon nitride film, which is accumulated on the inner wall of the process tube 203 or the surface of the boat 217, when passing through the processing chamber 201. At this time, the thin film is removed by a thermochemical reaction. That is, the thin film is removed by an etching reaction between the deposit and active species caused by a thermal decomposition of the $F_2$ and NO gases.

After a predetermined etching time of the thin film and completing the first step (etching process of the thin film), the second step (treatment process) is performed in succession. In the treatment process, extraneous materials remaining in the processing chamber 201 are removed, and the surface of a quartz member in the processing chamber 201 is smoothed. That is, the treatment process removes a quartz crack generated on the surface of the quartz member of the process tube 203 or boat 217, fine quartz powder (quartz powder) generated from the quartz crack and adhered to the surface of the member in the processing chamber 201, or extraneous materials such as a remaining film of silicon nitride.

[Second Step (Treatment Process)]

The inside of the processing chamber 201 is vacuum-exhausted by the vacuum exhaust device 246 to reach a predetermined pressure, i.e., a second pressure, when the boat 217 having no wafer 200 is not carried (boat-loaded) into the processing chamber 201. In this case, the pressure in the processing chamber 201 is measured by the pressure sensor 245, and the pressure regulator 242 is feedback-controlled based on information on the measured pressure. The inside of the processing chamber 201 is heated by the heater 206 for the temperature in the processing chamber 201 to reach a predetermined temperature, i.e., a second temperature. In this case, a power-supplying state to the heater 206 is feedback-controlled based on temperature information detected by the temperature sensor 263, so that the temperature in the processing chamber 201 reaches a predetermined temperature distribution. If the pressure and the temperature in the processing chamber 201 reach the second pressure and the second temperature, respectively, the pressure and the temperature are maintained until the second step is completed.

The second pressure is preferably set to be equal to the first pressure. That is, when the second step (treatment process) is performed after the first step (etching process of the thin film), the pressure in the processing chamber 201 is not changed but preferably maintained at a pressure equal to the first pressure. Thus, it is unnecessary to perform a process of changing the pressure in the processing chamber 201 into the second pressure when the second pressure is set to be equal to the first pressure.

The second temperature may be set to be a temperature higher than the first temperature. That is, when the second step (treatment process) is performed after the first step (etching process of the thin film), the temperature in the processing chamber 201 is changed into a temperature higher than the first temperature.

Next, $F_2$ and NO gases as cleaning gases are supplied into the processing chamber 201 from the $F_2$ and NO gas supply sources 274 and 275 as cleaning gas supply sources when the temperature and the pressure in the processing chamber 201 are maintained at the second temperature and the second pressure, respectively. When the valves 262e, 261e, 262f, 261f, 262g, 261g, 262h and 261h are opened, the $F_2$ and NO gases supplied into the cleaning gas supply pipes 232e, 232f, 232g and 232h from the $F_2$ and NO gas supply sources 274 and 275 are controlled to have predetermined flow rates in the MFCs 241e, 241f, 241g and 241h, pass through the cleaning gas supply pipes 232e, 232f, 232g and 232h, and are then introduced through the nozzles 230a and 230b into the processing chamber 201 via the processing gas supply pipes 232a and 232b, respectively.

Simultaneously, a $N_2$ gas may be supplied into the processing chamber 201 from the $N_2$ gas supply source 273 as an inert gas supply source, so that the $N_2$ gas may be used to dilute the $F_2$ and NO gases that are the cleaning gases. For example, when the valves 262c, 261c, 262d and 261d are opened, the $N_2$ gas supplied into the inert gas supply pipes 232c and 232d from the $N_2$ gas supply source 273 are controlled to have predetermined flow rates in the MFCs 241c and 241d, pass through the inert gas supply pipes 232c and 232d, and are then introduced through the nozzles 230a and 230b into the processing chamber 201 via the processing gas supply pipes 232a and 232b, respectively. The $N_2$ gas is mixed with the $F_2$ and NO gases in the processing gas supply pipes 232a and 232b, respectively. The concentration of the $F_2$ gas may be controlled by controlling the supply flow rate of the $N_2$ gas.

When the second step (treatment process) is performed after the first step (etching process of the thin film), the supply of the $F_2$ and NO gases or the supply of the diluted $F_2$ and NO gases may be maintained by opening the valves 262e, 261e, 262f, 261f, 262g, 261g, 262h and 261h or the valves 262c, 261c, 262d and 261d.

The $F_2$ and NO gases or the diluted $F_2$ and NO gases, introduced into the processing chamber 201, rise in the processing chamber 201, and flows into the tubular space 250 from the top opening of the inner tube 204. Then, the $F_2$ and NO gases or the diluted $F_2$ and NO gases flow down in the tubular space 250, and are exhausted from the exhaust pipe 231. The $F_2$ and NO gases or the diluted $F_2$ and NO gases come in contact with fine quartz powder adhered to the inside of the processing chamber 201, extraneous materials such as a remaining film of silicon nitride, or the surface of the quartz member (the process tube 203, the boat 217, etc.) in the processing chamber 201, when passing through the processing chamber 201. At this time, the extraneous materials such as the quartz powder or remaining film of silicon nitride are removed, so that the surface of the quartz member in the processing chamber 201 is smoothed by being slightly etched by a thermochemical reaction. That is, the extraneous materials are removed by an etching reaction between active species caused by a thermal decomposition of the $F_2$ and NO gases and the extraneous materials as well as the surface of the quartz member, so that the surface of the quartz member is smoothed.

The second step (treatment process) is not limited to the case where the $F_2$ and NO gases or the diluted $F_2$ and NO gases are supplied as the cleaning gases, but the $F_2$ gas or the diluted $F_2$ gas may be unilaterally supplied as the cleaning gas. In this case, during the treatment process, the temperature in the processing chamber 201 may be set to be the second temperature higher than the first temperature. Thus, the etching rate of the quartz member can be sufficiently increased even when the $F_2$ gas or the $F_2$ gas diluted with the inert gas is unilaterally supplied as the cleaning gas. Similar to the case where the $F_2$ and NO gases or the $F_2$ and NO gases diluted with the inert gas are supplied, this treatment process may remove the extraneous materials such as the quartz powder or remaining film of silicon nitride, so that the surface of the quartz member can be smoothed.

After a predetermined treatment time and completing the second step (treatment process), the supply of the $F_2$ and NO gases is stopped. That is, the valves 262e, 261e, 262f, 261f, 262g, 261g, 262h and 261h are closed to stop supplying the $F_2$ and NO gases into the processing chamber 201 from the $F_2$ and NO gas supply sources 274 and 275. Then, the valves 262c, 261c, 262d and 261d are opened to supply the $N_2$ gas into the processing chamber 201 from the $N_2$ gas supply source 273. The $N_2$ gas then is exhausted from the exhaust pipe 231 to purge the inside of the processing chamber 201. The inside of the processing chamber 201 is replaced with the $N_2$ gas, and the pressure in the processing chamber 201 is restored to the atmospheric pressure.

The etching condition of the thin film in the first step (etching process of the thin film) is preferably set to be a condition in which the etching rate of the deposit including the thin film is greater than that of the quartz member. The treatment condition in the second step (treatment process) is preferably set to be a condition in which the etching of the quartz member is more promoted, i.e., a condition in which the etching rate of the quartz member in the second step is greater than that of the quartz member in the first step.

For example, the etching conditions of the thin film in the first step (etching process of the thin film) are as follows:

First temperature: less than 400 degrees C., preferably 200 to 350 degrees C.,

First pressure 1330 Pa (10 Torr) to 101300 Pa (atmospheric pressure), preferably not less than 13300 Pa (100 Torr) and not more than 53320 Pa (400 Torr),
Supply flow rate of $F_2$ gas: 0.5 to 5 slm,
Supply flow rate of NO gas: 0.5 to 5 slm,
Supply flow rate of $N_2$ gas: 1 to 20 slm, and
Flow rate ratio of NO gas/$F_2$ gas: 0.5 to 2.

Each etching condition is constantly maintained at a certain value in each range, so that the etching of the deposit including the thin film is performed.

For example, the treatment conditions in the second step (treatment process) are as follows:
Second temperature: not less than 400 degrees C., preferably 400 to 500 degrees C.,
Second pressure 1330 Pa (10 Torr) to 25500 Pa (200 Torr), preferably not less than 13300 Pa (100 Torr) and not more than 19950 Pa (150 Torr),
Supply flow rate of $F_2$ gas: 0.5 to 5 slm,
Supply flow rate of NO gas: 0.5 to 5 slm,
Supply flow rate of $N_2$ gas: 1 to 20 slm, and
Flow rate ratio of NO gas/$F_2$ gas: 0 to 1, preferably 0.05 to 1.

Each treatment condition is constantly maintained at a certain value in each range, so that the treatment process is performed. In a case where the supply flow rate of the NO gas is 0 slm and the flow rate ratio of NO gas/$F_2$ gas is zero, the $F_2$ gas or the diluted $F_2$ gas is unilaterally supplied as the cleaning gas.

FIG. 3 illustrates an example of the processing conditions of the first step (etching process of the thin film) where the temperature (first temperature) in the processing chamber 201 is set to be 300 degrees C., the flow rate of $F_2$ gas is set to be 2.0 slm, the flow rate of the NO gas is set to be 1.0 slm, and the pressure in the processing chamber 201 is set to be 26664 Pa (200 Torr); and the processing conditions in the second step (treatment process), where the temperature (second temperature) in the processing chamber 201 is set to be 400 degrees C., the flow rate of $F_2$ gas is set to be 2.0 slm, the flow rate of the NO gas is set to be 0.5 slm, and the pressure in the processing chamber 201 is set to be 13332 Pa (100 Torr).

In the first step (the etching process of the thin film), the etching rate of the deposit including the thin film is preferably greater than that of the quartz member. In the second step (treatment process), the second temperature is preferably higher than the first temperature so that the etching of the quartz member is more promoted. In this case, the second pressure is more preferably lower than the first pressure. It is assumed that the flow rate ratio of the NO gas to the $F_2$ gas (the flow rate ratio of NO gas/$F_2$ gas) in the first step (etching process of the thin film) is set to be a first flow rate ratio, and the flow rate ratio of the NO gas to the $F_2$ gas (the flow rate ratio of NO gas/$F_2$ gas) in the second step (treatment process) is set to be a second flow rate ratio. In this case, the second flow rate ratio is preferably smaller than the first flow rate ratio.

The first flow rate ratio (the flow rate ratio of NO gas/$F_2$ gas) is preferably set to be not less than 0.5 and not more than 2. If the flow rate ratio of NO gas/$F_2$ gas is less than 0.5, the effect obtained by adding the NO gas to the $F_2$ gas is weakened, and therefore, the etching rate of the deposit including the thin film is lowered. If the flow rate ratio of NO gas/$F_2$ gas is more than 2, the NO gas is excessively added to the $F_2$ gas. In this case, the etching rate of the deposit including the thin film is also lowered. Therefore, the first flow rate ratio (the flow rate ratio of NO gas/$F_2$ gas) is preferably not less than 0.5 and not more than 2.

The second flow rate ratio (the flow rate ratio of NO gas/$F_2$ gas) may be not less than 0 and not more than 1, preferably not less than 0.05 and not more than 1. If the flow rate ratio of NO gas/$F_2$ gas is more than 1, the etching rate of the quartz member is excessively increased, and therefore, the quartz member is unevenly etched. It is possible that the flow rate ratio of NO gas/$F_2$ gas is zero, i.e., that the quartz member is etched using only the $F_2$ gas. However, the etching rate of the quartz member may be increased by adding the NO gas to the $F_2$ gas. That is, the etching rate of the quartz member may be increased by setting the flow rate ratio of NO gas/$F_2$ gas to be at least 0.05 or more. Therefore, the second flow rate ratio (the flow rate ratio of NO gas/$F_2$ gas) may be not less than 0 and not more than 1, preferably not less than 0.05 and not more than 1. The case where the second flow rate ratio is zero means that the $F_2$ gas or the diluted $F_2$ gas is unilaterally supplied as the cleaning gas.

When the second temperature is higher than the first temperature, the second pressure is controlled to be lower than the first pressure, or the second flow rate ratio is controlled to be lower than the first flow rate ratio, so that it is possible to prevent the quartz member from being unevenly etched due to the occurrence of the ununiformity in the etching of the quartz member in the second step (treatment process). That is, the quartz member can be evenly etched even in the state in which the etching of the quartz member is more promoted. When the flow rate ratio of NO gas/$F_2$ gas is changed from the first flow rate ratio to the second flow rate ratio, as shown in the example of FIG. 3, only the flow rate of the NO gas is preferably changed (decreased) while maintaining the flow rate of the $F_2$ gas. On the other hand, only the flow rate of the $F_2$ gas may be changed (increased) while maintaining the flow rate of the NO gas. Accordingly, the operation of changing (regulating) the flow rate ratio can be simplified, as compared with a case where both the flow rate of the $F_2$ and the flow rate of the NO gases are changed.

If the cleaning process, i.e., the first step (etching process of the thin film) and the second step (treatment process) are finished, the thin film forming process is resumed.

(4) Certain Effects (a) According to an embodiment of the present disclosure, in the first step (etching process of the thin film), the $F_2$ and NO gases or the $F_2$ and NO gases diluted with the inert gas are supplied as the cleaning gases. Accordingly, the $F_2$ gas is not alone used but used by adding the NO gas thereto, so that even if the temperature in the inside of the processing chamber 201 is set to be, for example, less than 400 degrees C., it is possible to sufficiently increase the etching rate of the silicon nitride film and to reduce the time required to remove the silicon nitride film, thereby improving the productivity of the substrate processing apparatus.

(b) According to an embodiment of the present disclosure, the temperature condition in the first step (etching process of the thin film) is set to be the first temperature (less than 400 degrees C., preferably 200 to 350 degrees C.), so that it is possible to sufficiently increase the etching selection ratio of the silicon nitride layer and quartz and to prevent uneven etching damage that has influence on the quartz member constituting the processing chamber 201. Practically, the deposit including the silicon nitride film may not be equally adhered to the inside of the processing chamber 201 to be cleaned. For example, the film thickness of the deposit may be locally thin or thick. Also, the etching rate of the deposit may be locally changed because the temperature in the surface of the inner wall of the processing chamber 201 is uneven or the pressure of the cleaning gas in the processing chamber 201 is uneven. In this case, in order to remove the entire deposit adhered to the inside of the processing chamber 201, a partial surface of the inner wall of the processing chamber 201 made of quartz glass ($SiO_2$) may be exposed to the cleaning gas for a long period of time, thereby causing damages. In order to reduce the damages, it is effective to increase the selection ratio as described above.

(c) According to an embodiment of the present disclosure, the temperature condition of the second step (treatment process) is set to be the second temperature (not less than 400 degrees C., preferably 400 to 500 degrees C.) higher than the first temperature. Accordingly, it is possible to obtain a sufficient etching speed for the quartz member. If the temperature condition is set to be the second temperature, the etching of the silicon nitride film is sufficiently performed. Thus, it is possible to remove the extraneous materials such as the fine quartz power or remaining film of the silicon nitride, attached to the inside of the processing chamber 201 after the first step, and to prevent an increase in the effective surface area in the processing chamber 201 by slightly etching the surface of the quartz member in the processing chamber 201 so as to be smoothed. Accordingly, it is possible to prevent the occurrence of foreign matters in the processing chamber 201 and to prevent the speed at which the thin film is formed from being lowered in the thin film forming process just after performing the cleaning process, i.e., the first step (etching process of the thin film) and the second step (treatment process). When the temperature in the processing chamber 201 is set to be 400 to 450 degrees C., the etching rate of the quartz is identical to or slightly lower than that of the silicon nitride film, but it is possible to sufficiently perform the etching of the quartz. When the temperature in the processing chamber 201 is set to be 450 to 500 degrees C., the etching rate of the quartz becomes greater than that of the silicon nitride film, and it is possible to more rapidly perform the smoothing of the surface of the quartz member such as the process tube 203 or the boat 217.

(d) According to an embodiment of the present disclosure, the temperature condition of the second step (treatment process) is set to be the second temperature (not less than 400 degrees C., preferably 400 to 500 degrees C.) higher than the first temperature. Accordingly, although the $F_2$ gas or the $F_2$ gas diluted with the inert gas is unilaterally supplied as the cleaning gas, it is possible to sufficiently increase the etching rate of the quartz member. Similarly to the case where the $F_2$ and NO gases or the $F_2$ and NO gases diluted with the inert gas are supplied as the cleaning gases, it is possible to remove the extraneous materials such as the quartz powder or remaining film of the silicon nitride layer, thereby smoothing the surface of the quartz member.

(e) According to an embodiment of the present disclosure, in the first step (etching process of the thin film), the NO gas is added to the $F_2$ used as the cleaning gas. Thus, it is possible to increase the etching rate in a low-temperature area and to perform the etching under a low-temperature condition of less than 400 degrees C. Accordingly, it is possible to prevent corrosion of the metal member (low-temperature member), e.g., the manifold 209, the seal cap 219, the rotation shaft 255, the exhaust pipe 231, the pressure regulator 242, etc. in the processing chamber 201 or the gas flow path. That is, according to one embodiment of the present disclosure, it is possible to remove the deposit formed on the metal member (low-temperature member) while preventing the corrosion of the metal member.

(f) According to an embodiment of the present disclosure, both the temperature conditions of the first step (etching process of the thin film) and the second step (treatment process) are set to be a temperature of being not more than 500 degrees C. Thus, it is possible to reduce the corrosion of the metal member in the processing chamber 201 or in the gas flow path.

(g) According to an embodiment of the present disclosure, when the second temperature in the second step (treatment process) is higher than the first temperature in the first step (etching process of the thin film), the second pressure in the second step (treatment process) is controlled to be lower than the first pressure in the first step (etching process of the thin film) and/or the second flow rate ratio (flow rate ratio of NO gas/$F_2$ gas) in the second step (treatment process) is controlled to be smaller than the first flow rate ratio (flow rate ratio of NO gas/$F_2$ gas) in the first step (etching process of the thin film). Accordingly, in the second step (treatment process), the etching rate of the quartz member is increased, so that it is possible to prevent the quartz member from being unevenly etched due to the occurrence of the ununiformity in the etching of the quartz member. That is, it is possible to evenly etch the quartz member in the state in which the etching of the quartz member is more promoted. The case where the second pressure is controlled to be lower than the first pressure and/or the second flow rate ratio is controlled to be smaller than the first flow rate ratio includes a case where the second pressure is controlled to be lower than the first pressure, a case where the second flow rate ratio is controlled to be smaller than the first flow rate ratio, or a case where the second pressure is controlled to be lower than the first pressure and the second flow rate ratio is controlled to be smaller than the first flow rate ratio.

(h) According to an embodiment of the present disclosure, in the first step (etching process of the thin film) and the second step (treatment process), a hydrogen-containing gas such as an HF gas or an $H_2$ gas as the cleaning gas is not supplied into the processing chamber 201. Hence, it is possible to prevent corrosion of the metal member, caused by HF, in the processing chamber 201 or the gas flow path, so that it is possible to prevent the occurrence of metal contamination in the processing chamber 201. Further, it is possible to prevent damage of the quartz member by preventing the corrosion of the quartz member, caused by HF, in the processing chamber 201.

Another Embodiment of the Present Disclosure

When a practical operation of an apparatus is considered, particularly, when the thickness of a thin film formed through each thin film forming process is thick, it is required to perform a dry cleaning process in a relatively short period of time, and the operation rate of the substrate processing apparatus may be lowered. Thus, an operation rate of the apparatus may be increased by combining the cleaning process according to the above-described embodiment and a low temperature purge (LTP) process. Here, the LTP process performs a gas-purging at the inside of the processing chamber 201 in which the temperature in the processing chamber 201 is dropped so that cracks are forcibly generated by providing a thermal shock against the thin film deposited on the surface of the member in the processing chamber 201, and extraneous materials having weak adhesion are forcibly exfoliated. The LTP process is also called as a low temperature purge process.

In this embodiment, the temperature in the processing chamber 201 is dropped in the state in which there exist one or more wafers 200 in the processing chamber 201 under the thin film forming process or just after the thin film forming process, or in the state in which there exists no wafer 200 in the processing chamber 201, so that cracks are forcibly generated by providing thermal shock to the thin film deposited on the surface of the member in the processing chamber 201.

In addition, the extraneous materials having weak adhesion are forcibly exfoliated, and then the gas-purging is performed at the inside of the processing chamber 201. The gas-purging may be performed every time when the thin film forming process is performed or periodically. Accordingly, the thickness of the deposited film can be increased until the thin film deposited on the surface of the member in the processing chamber 201 is exfoliated/dropped, and thus, it is possible to perform a cleaning process with an extended internal period. Similar to the above, the cleaning process is performed at the time when the thickness of the thin film deposited on the surface of the member in the processing chamber 201 reaches a predetermined thickness. Accordingly, it is possible to extend the lifetime of the quartz member such as the process tube 203, and thus, it is unnecessary to perform maintenance followed by a replacement of the quartz member for a long period of time.

In the LTP process, the rapid drop of the temperature in the processing chamber 201 is preferably performed from a film forming temperature of more than 600 degrees C. to a low temperature of 200 to 400 degrees C., at which cracks are generated, during the thin film forming process or between the thin film forming process and the next thin film forming process. When the temperature in the processing chamber 201 is rapidly dropped, the inside of the processing chamber 201 may be forcibly cooled (rapidly cooled) by flowing a gaseous cooling medium such as air or $N_2$ at the outside of the processing chamber 201 while exhausting a high-temperature atmospheric gas to the outside of the processing chamber 201. In this case, the inside of the processing chamber 201 is forcibly cooled by allowing the gaseous cooling medium to directly contact the entire external surface of the process tube 203 by the forced cooling mechanism (rapid cooling mechanism) 400 described above. Thus, the forced cooling mechanism 400, the heater 206, the purge gas supply system and the exhaust system are controlled by the controller 280 so that the inside of the processing chamber 201 is gas-purged while dropping the temperature in the processing chamber 201. When the temperature in the processing chamber 201 is dropped by forcibly cooling the inside of the processing chamber 201, the shutters 460 and 470 are opened, and the high-temperature atmospheric gas in the heat insulating cover 410 is exhausted using the exhaust blower 490. Simultaneously, the cooling medium such as the air or $N_2$ is introduced into the heat insulating cover 410 by the introductory blower 450.

The LTP process may be performed not by using the forced cooling mechanism 400 but by allowing the controller 280 to control the heater 206, the purge gas supply system and the exhaust system so that the inside of the processing chamber 201 is gas-purged while dropping the temperature in the processing chamber 201. However, the rapid drop of the temperature in the processing chamber 201 is preferably performed using the forced cooling mechanism 400. This is because the thermal shock provided to the thin film deposited on the surface of the member in the processing chamber 201 is increased, and thus, it is possible to improve the effect of discharging particles. The LTP process may be performed every time when the thin film forming process is performed, or may be performed periodically. When considering the effect of discharging particles, the LTP process is preferably performed every time when the thin film forming process is performed.

In this embodiment, a halogen-based gas (fluorine-based gas) such as a $ClF_3$ or $NF_2$ gas may be used as the fluorine-based gas other than the $F_2$ gas. However, when a thin film is formed by the LTP and dry cleaning processes, as described above, the cleaning process having the first step (etching process of the thin film) and the second step (treatment process) and the LTP process are preferably combined using the $F_2$ gas as the fluorine-based gas. In a case where the $ClF_3$ gas, the $NF_2$ gas, etc. is used as the fluorine-based gas, the cleaning process having the first step (etching process of the thin film) and the second step (treatment process) and the LTP process are preferably combined.

In a case where the etching process of the thin film using a fluorine-based gas such as a $F_2$, $ClF_3$ or $NF_2$ gas and a nitrogen oxide-based gas and the LTP process are combined (in a case where the treatment process is not performed after the etching process of the thin film), the following disadvantages may be entailed.

As shown in FIG. 4A, a foreign matter such as quartz powder remains on the surface of quartz after the etching (cleaning) process of a thin film. The foreign matter is adhered to the surface of the quartz in an unstable state. In the thin film forming process (SiN deposition), the thin film is deposited on the foreign matter. If the LTP process is performed in this state, the crack or exfoliation is generated on the thin film as well as on the foreign matter adhered to the surface of the quartz. The adhesion state of the foreign matter to the surface of the quartz is more unstabilized, and therefore, the generation of the foreign matter is not stopped. Since the adhesion state of the foreign matter to the surface of the quartz is further unstabilized, the foreign matter is easily generated even when the thin film is formed (SiN deposition).

However, in a case where the cleaning process having the first step (etching process of the thin film) and the second step (treatment process) and the LTP process are combined, advantages are as follows.

As shown in FIG. 4B, after the etching (cleaning) process of the thin film is performed and the treatment process is then performed, it is possible to prevent the foreign matter from remaining on the surface of the quartz. That is, the foreign matter adhered to the surface of the quartz in the unstable state does not exist. In the thin film forming process (SiN deposition), the thin film is deposited on the surface of the quartz in the state in which no foreign matter exists (SiN deposition). If the LTP process is performed in this state, the foreign matter is not adhered to the surface of the quartz, although a crack or exfoliation is generated on the thin film. Therefore, the foreign matter is not generated. The foreign matter is not generated even when the thin film is formed after the LTP process is performed.

From these advantages, in a case where a thin film is formed by the specification of the LTP and dry cleaning processes, it can be seen that the cleaning process having the first step (etching process of the thin film) and the second step (treatment process) and the LTP process are preferably combined.

Another Embodiment of the Present Disclosure

Although it has been described in the above-described embodiment that the nitrogen monoxide (NO) gas is used as the nitrogen oxide-based gas, the present disclosure is not limited thereto. For example, a nitrous oxide ($N_2O$) gas, nitrogen dioxide ($NO_2$) gas, etc. may be used as the nitrogen oxide-based gas. In a case where the $N_2O$ or $NO_2$ gas is used as the nitrogen oxide-based gas, a NO gas is preferably generated by mounting a pre-heater in the cleaning gas supply pipes 232g and 232h and pre-heating the $N_2O$ or $NO_2$ gas before being supplied into the processing chamber 201.

Although it has been described in the above-described embodiment that the thin film is formed using a batch type substrate processing apparatus that processes a plurality of sheets of substrates at a time, the present disclosure is not limited thereto, and may be appropriately applied to a case where the thin film is formed using a single type substrate processing apparatus that processes one or several sheets of substrates at a time.

The above-described embodiment, each application, etc. may be used through an appropriated combination thereof.

The present disclosure may be implemented, for example, by changing a process or cleaning recipe of the related art substrate processing apparatus. In a case where the process or cleaning recipe is changed, the process or cleaning recipe according to the present disclosure may be installed in the related art substrate processing apparatus through an electrical communication line or a recording medium in which the process or cleaning recipe is recorded. Alternatively, an I/O device of the related art substrate processing apparatus may be manipulated, and the process or cleaning recipe of the related art substrate processing apparatus may be changed into that of the present disclosure.

Although the embodiments of the present disclosure have been described in detail, the present disclosure is not limited thereto. Accordingly, various modifications and changes can be made thereto without departing from the spirit and scope of the present disclosure.

Example

The cleaning in the processing chamber was performed by repeating a process of forming a $Si_3N_4$ film on wafers in the processing chamber of the substrate processing apparatus described above and then performing the first step (etching process of the thin film) and the second step (treatment process). In this case, the processing, etching and treatment conditions were set to be those as described in the above-described embodiments, respectively. The surfaces of the quartz member in the processing chamber before/after the second step (treatment process) were observed using a scanning electron microscope (SEM).

Figure 5A:
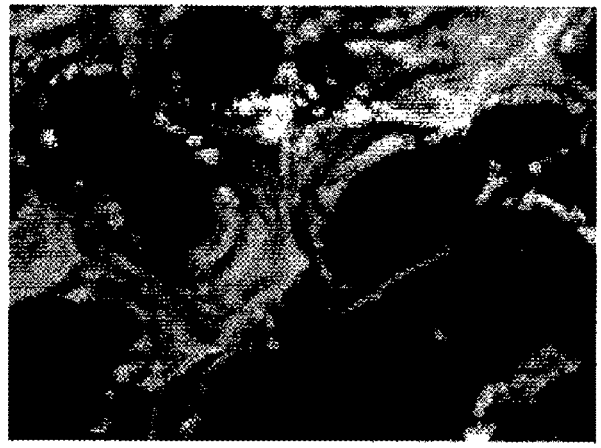
FIG. 5A is a scanning electron microscope (SEM) photograph illustrating a change on a surface of a quartz when a treatment process is not performed after an etching process of a thin film.
Figure 5B:
FIG. 5B is an SEM photograph illustrating a change on a surface of a quartz when a treatment process has been performed.

The SEM photograph is shown in FIGS. 5A and 5B. FIG. 5A is an SEM photograph showing a surface of the quartz member after the first step (etching process of the thin film) is performed and before the second step (treatment process) is performed. FIG. 5B is an SEM photograph showing a surface of the quartz member after the second step (treatment process). From FIGS. 5A and 5B, it can be seen that extraneous materials such as a crack, quartz powder or remaining film of silicon nitride of the surface of the quartz member, generated after the first step (etching process of the thin film) are removed by the second step (treatment process), and thus the surface of the quartz member is smoothed. That is, the second step (treatment process) is performed after the first step (etching process of the thin film) is performed, so that it is possible to prevent an increase in the effective surface area in the processing chamber. Accordingly, it is possible to prevent the generation of a foreign matter in the processing chamber and to prevent the film forming speed from being lowered in the thin film forming process just after the cleaning process, i.e., the first step (etching process of the thin film) and the second step (treatment process) are performed.

Additional Aspects of Present Disclosure

Hereinafter, some aspects of the present disclosure will be additionally stated.

One aspect of the present disclosure may provide a method of cleaning an inside of a processing chamber by supplying a cleaning gas into the processing chamber after performing a process of forming a thin film on a substrate in the processing chamber. Such method includes supplying a fluorine-based gas and a nitrogen oxide-based gas or a fluorine-based gas and a nitrogen oxide-based gas diluted with an inert gas, as the cleaning gas, into the processing chamber heated to a first temperature, and removing a deposit, including the thin film, deposited on a surface of a member in the processing chamber, by a thermochemical reaction, and changing a temperature in the processing chamber to a second temperature higher than the first temperature. Further, the method includes supplying the fluorine-base gas and the nitrogen oxide-based gas or the fluorine-based gas and the nitrogen oxide-based gas diluted with the inert gas, as the cleaning gas, into the processing chamber heated to the second temperature, and removing extraneous materials remaining on the surface of the member in the processing chamber after removing the deposit including the thin film by a thermochemical reaction.

In some embodiments, a flow rate ratio of the nitrogen oxide-based gas to the fluorine-based gas (flow rate ratio of the nitric oxide-based gas/the fluorine-based gas) is set to be a first flow rate ratio in the removing of the deposit including the thin film by the thermochemical reaction, the flow rate ratio of the nitrogen oxide-based gas to the fluorine-based gas (flow rate ratio of the nitric oxide-based gas/the fluorine-based gas) is set to be a second flow rate ratio in the removing of the extraneous materials by the thermochemical reaction, and the second flow rate ratio is smaller than the first flow rate ratio.

In some embodiments, a pressure in the processing chamber is set to be a first pressure in the removing of the deposit including the thin film by the thermochemical reaction, the pressure in the processing chamber is set to be a second pressure in the removing of the extraneous materials by the thermochemical reaction, and the second pressure is lower than the first pressure.

In some embodiments, the surface of the member is etched and smoothed in the removing of the extraneous materials by the thermochemical reaction.

In some embodiments, the first temperature is set to be less than 400 degrees C., and the second temperature is set to be not less than 400 degrees C.

In some embodiments, the first temperature is set to be not less than 200 degrees C. and not more than 350 degrees C., and the second temperature is set to be not less than 400 degrees C. and not more than 500 degrees C.

In some embodiments, the member includes a quartz member.

In some embodiments, the member includes a quartz member and a metal member.

In some embodiments, the member includes a member constituting the processing chamber, and the member constituting the processing chamber includes a quartz member.

In some embodiments, the member includes a member constituting the processing chamber, and the member constituting the processing chamber includes a quartz member and a metal member.

In some embodiments, the extraneous materials remaining on the surface of the member in the processing chamber includes quartz powder.

In some embodiments, the deposit including the thin film is conditioned to be further etched than the quartz member in the removing of the deposit including the thin film by the thermochemical reaction, and the quartz member is conditioned to be further etched than the deposit including the thin film in the removing of the extraneous materials by the thermochemical reaction.

In some embodiments, the method further includes dropping the temperature in the processing chamber after performing the process of forming the thin film on the substrate to a temperature lower than a temperature in the processing chamber while performing the process of forming the thin film on the substrate to provide thermal shock against the deposit including the thin film deposited on the surface of the member in the processing chamber, wherein a crack is forcibly generated in the deposit, and the inside of the processing chamber is gas-purged.

In some embodiments, the fluorine-based gas includes at least one of a $F_2$ gas, a $ClF_3$ gas and a $NF_3$ gas, and the nitrogen oxide-based gas includes at least one of a NO gas, a $N_2O$ gas and a $NO_2$ gas.

In some embodiments, the fluorine-based gas is a $F_2$ gas, and the nitrogen oxide-based gas is a NO gas.

Another aspect of the present disclosure may provide a method of manufacturing a semiconductor device. Such method includes loading a substrate into a processing chamber, performing a process of forming a thin film on the substrate by supplying a processing gas into the processing chamber, unloading the substrate after the process has been completed from the inside of the processing chamber, and cleaning the inside of the processing chamber by supplying a cleaning gas into the processing chamber, from which the substrate unloaded. In the method, the cleaning of the inside of the processing chamber includes supplying a fluorine-based gas and a nitrogen oxide-based gas or a fluorine-based gas and a nitrogen oxide-based gas diluted with an inert gas, as the cleaning gas, into the processing chamber heated to a first temperature, and removing a deposit, including the thin film deposited on a surface of a member in the processing chamber, by a thermochemical reaction and changing a temperature in the processing chamber to a second temperature higher than the first temperature. The cleaning of the inside of the processing chamber further includes supplying the fluorine-based gas and the nitrogen oxide-based gas or the fluorine-based gas and the nitrogen oxide-based gas diluted with the inert gas, as the cleaning gas, into the processing chamber heated to the second temperature, and removing extraneous materials, remaining on the surface of the member in the processing chamber after removing the deposit including the thin film by a thermochemical reaction.

Another aspect of the present disclosure may provide a substrate processing apparatus. The substrate processing apparatus includes a processing chamber in which a thin film is formed on a substrate, a processing gas supply system configured to supply a processing gas into the processing chamber, a cleaning gas supply system configured to supply a cleaning gas into the processing chamber, and a heater configured to heat an inside of the processing chamber. The substrate processing apparatus also includes a controller configured to control the heater, the processing gas supply system and the cleaning gas supply system when cleaning the inside of the processing chamber by supplying the cleaning gas into the processing chamber after performing the process of forming the thin film on the substrate by supplying the processing gas into the processing chamber, so as to perform a process of supplying a fluorine-based gas and a nitrogen oxide-based gas or a fluorine-based gas and a nitrogen oxide-based gas diluted with an inert gas, as the cleaning gas, into the processing chamber heated to a first temperature, and removing a deposit, including the thin film deposited on a surface of a member in the processing chamber, by a thermochemical reaction, a process of changing the temperature in the processing chamber to a second temperature higher than the first temperature, and a process of supplying the fluorine-based gas and the nitrogen-oxide-based gas or the fluorine-based gas and the nitrogen oxide-based gas diluted with the inert gas, as the cleaning gas, into the processing chamber heated to the second temperature, and removing extraneous materials, remaining on the surface of the member in the processing chamber after removing the deposit including the thin film by a thermochemical reaction.

Another aspect of the present disclosure may provide a program that causes a computer to perform a process of cleaning an inside of a processing chamber by supplying a cleaning gas into the processing chamber after performing a process of forming a thin film on a substrate in the processing chamber. The process of cleaning includes supplying a fluorine-based gas and a nitrogen oxide-based gas or a fluorine-based gas and a nitrogen oxide-based gas diluted with an inert gas, as the cleaning gas, into the processing chamber heated to a first temperature, and removing a deposit including the thin film, deposited on a surface of a member in the processing chamber, by a thermochemical reaction and changing a temperature in the processing chamber into a second temperature higher than the first temperature. The process of cleaning further includes supplying the fluorine-based gas and the nitrogen oxide-based gas or the fluorine-based gas and the nitrogen oxide-based gas diluted with the inert gas, as the cleaning gas, into the processing chamber heated to the second temperature, and removing extraneous materials, remaining on the surface of the member in the processing chamber after removing the deposit including the thin film by a thermochemical reaction.

Another aspect of the present disclosure may provide a non-transitory computer-readable recording medium storing a program that causes a computer to perform a process of cleaning an inside of a processing chamber by supplying a cleaning gas into the processing chamber after performing a process of forming a thin film on a substrate in the processing chamber. The process of cleaning includes supplying a fluorine-based gas and a nitrogen oxide-based gas or a fluorine-based gas and a nitrogen oxide-based gas diluted with an inert gas, as the cleaning gas, into the processing chamber heated to a first temperature, and removing a deposit, including the thin film deposited on a surface of a member in the processing chamber, by a thermochemical reaction, and changing a temperature in the processing chamber to a second temperature higher than the first temperature. The process of cleaning further includes supplying the fluorine-based gas and the nitrogen oxide-based gas or the fluorine-based gas and the nitrogen oxide-based gas diluted with the inert gas, as the cleaning gas, into the processing chamber heated to the second temperature, and removing extraneous materials, remaining on the surface of the member in the processing chamber after removing the deposit including the thin film by a thermochemical reaction.

According to the present disclosure in some embodiments, when a thin film deposited in the processing chamber is removed, it is possible to reduce the time required to remove the thin film, and to prevent uneven etching damage that has influence on the quartz member constituting the processing chamber.

While certain embodiments have been described, these embodiments have been presented by way of example only, and are not intended to limit the scope of the disclosures.

Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of cleaning an inside of a processing chamber by supplying a cleaning gas into the processing chamber after performing a process of forming a thin film on a substrate in the processing chamber, the method comprising:
supplying a fluorine-based gas and a nitrogen oxide-based gas or a fluorine-based gas and a nitrogen oxide-based gas diluted with an inert gas, as the cleaning gas, into the processing chamber heated to a first temperature, and removing a deposit, including the thin film deposited on a surface of a member in the processing chamber, by a thermochemical reaction;
changing a temperature in the processing chamber to a second temperature higher than the first temperature; and
supplying the fluorine-based gas and the nitrogen oxide-based gas or the fluorine-based gas and the nitrogen oxide-based gas diluted with the inert gas, as the cleaning gas, into the processing chamber heated to the second temperature, and removing extraneous materials, remaining on the surface of the member in the processing chamber after removing the deposit including the thin film by a thermochemical reaction,
wherein a flow rate ratio of the nitrogen oxide-based gas to the fluorine-based gas is set to be a first flow rate ratio in the removing of the deposit including the thin film, a flow rate ratio of the nitrogen oxide-based gas to the fluorine-based gas is set to be a second flow rate ratio in the removing of the extraneous materials, and the second flow rate ratio is smaller than the first flow rate ratio.

2. The method of claim 1, wherein a pressure in the processing chamber is set to be a first pressure in the removing of the deposit including the thin film, a pressure in the processing chamber is set to be a second pressure in the removing of the extraneous materials, and the second pressure is lower than the first pressure.

3. The method of claim 1, wherein the surface of the member is etched and smoothed in the removing of the extraneous materials.

4. The method of claim 1, wherein the first temperature is set to be less than 400 degrees C., and the second temperature is set to be not less than 400 degrees C.

5. The method of claim 1, wherein the first temperature is set to be not less than 200 degrees C. and not more than 350 degrees C., and the second temperature is set to be not less than 400 degrees C. and not more than 500 degrees C.

6. The method of claim 1, wherein the member includes a quartz member.

7. The method of claim 1, wherein the member includes a quartz member and a metal member.

8. The method of claim 1, wherein the member includes a member constituting the processing chamber, and the member constituting the processing chamber includes a quartz member.

9. The method of claim 1, wherein the member includes a member constituting the processing chamber, and the member constituting the processing chamber includes a quartz member and a metal member.

10. The method of claim 6, wherein the extraneous materials remaining on the surface of the member in the processing chamber include quartz powder.

11. The method of claim 6, wherein the deposit including the thin film is conditioned to be further etched than the quartz member in the removing of the deposit including the thin film by the thermochemical reaction, and the quartz member is conditioned to be further etched than the deposit including the thin film in the removing of the extraneous materials by the thermochemical reaction.

12. The method of claim 1, further comprising:
dropping the temperature in the processing chamber after performing the process of forming the thin film on the substrate to a temperature lower than a temperature in the processing chamber while performing the process of forming the thin film on the substrate to provide thermal shock against the deposit including the thin film deposited on the surface of the member in the processing chamber, wherein a crack is forcibly generated in the deposit, and the inside of the processing chamber is gas-purged.

13. The method of claim 1, wherein the fluorine-based gas includes at least one of a $F_2$ gas, a $ClF_3$ gas and a $NF_3$ gas, and the nitrogen oxide-based gas includes at least one of a NO gas, a $N_2O$ gas and a $NO_2$ gas.

14. The method of claim 1, wherein the fluorine-based gas is a $F_2$ gas, and the nitrogen oxide-based gas is a NO gas.

15. A method of manufacturing a semiconductor device, comprising:
loading a substrate into a processing chamber;
performing a process of forming a thin film on the substrate by supplying a processing gas into the processing chamber;
unloading the substrate after the process has been completed from the inside of the processing chamber; and
cleaning the inside of the processing chamber by supplying a cleaning gas into the processing chamber from which the substrate was unloaded,
wherein the cleaning of the inside of the processing chamber comprises:
supplying a fluorine-based gas and a nitrogen oxide-based gas or a fluorine-based gas and a nitrogen oxide-based gas diluted with an inert gas, as the cleaning gas, into the processing chamber heated to a first temperature, and removing a deposit, including the thin film deposited on a surface of a member in the processing chamber, by a thermochemical reaction;
changing a temperature in the processing chamber to a second temperature higher than the first temperature; and
supplying the fluorine-based gas and the nitrogen oxide-based gas or the fluorine-based gas and the nitrogen oxide-based gas diluted with the inert gas, as the cleaning gas, into the processing chamber heated to the second temperature, and removing extraneous materials, remaining on the surface of the member in the processing chamber after removing the deposit including the thin film by a thermochemical reaction,
wherein a flow rate ratio of the nitrogen oxide-based gas to the fluorine-based gas is set to be a first flow rate ratio in the removing of the deposit including the thin film, a flow rate ratio of the nitrogen oxide-based gas to the fluorine-based gas is set to be a second flow rate ratio in the removing of the extraneous materials, and the second flow rate ratio is smaller than the first flow rate ratio.

16. A substrate processing apparatus, comprising:
- a processing chamber in which a thin film is formed on a substrate;
- a processing gas supply system configured to supply a processing gas into the processing chamber;
- a cleaning gas supply system configured to supply a cleaning gas into the processing chamber;
- a heater configured to heat an inside of the processing chamber; and
- a controller configured to control the heater, the processing gas supply system and the cleaning gas supply system when cleaning the inside of the processing chamber by supplying the cleaning gas into the processing chamber after performing the process of forming the thin film on the substrate by supplying the processing gas into the processing chamber, so as to perform a process of supplying a fluorine-based gas and a nitrogen oxide-based gas or a fluorine-based gas and a nitrogen oxide-based gas diluted with an inert gas, as the cleaning gas, into the processing chamber heated to a first temperature, and removing a deposit, including the thin film deposited on a surface of a member in the processing chamber, by a thermochemical reaction; a process of changing a temperature in the processing chamber to a second temperature higher than the first temperature; and a process of supplying the fluorine-based gas and the nitrogen oxide-based gas or the fluorine-based gas and the nitrogen oxide-based gas diluted with the inert gas, as the cleaning gas, into the processing chamber heated to the second temperature, and removing extraneous materials, remaining on the surface of the member in the processing chamber after removing the deposit including the thin film by a thermochemical reaction,
- wherein a flow rate ratio of the nitrogen oxide-based gas to the fluorine-based gas is set to be a first flow rate ratio in the removing of the deposit including the thin film, a flow rate ratio of the nitrogen oxide-based gas to the fluorine-based gas is set to be a second flow rate ratio in the removing of the extraneous materials, and the second flow rate ratio is smaller than the first flow rate ratio.

17. A non-transitory computer-readable recording medium storing a program that causes a computer to perform a process of cleaning an inside of a processing chamber by supplying a cleaning gas into the processing chamber after performing a process of forming a thin film on a substrate in the processing chamber, wherein the process of cleaning comprises:
- supplying a fluorine-based gas and a nitrogen oxide-based gas or a fluorine-based gas and a nitrogen oxide-based gas diluted with an inert gas, as the cleaning gas, into the processing chamber heated to a first temperature, and removing a deposit, including the thin film deposited on a surface of a member in the processing chamber, by a thermochemical reaction;
- changing a temperature in the processing chamber to a second temperature higher than the first temperature; and
- supplying the fluorine-based gas and the nitrogen oxide-based gas or the fluorine-based gas and the nitrogen oxide-based gas diluted with the inert gas, as the cleaning gas, into the processing chamber heated to the second temperature, and removing extraneous materials, remaining on the surface of the member in the processing chamber after removing the deposit including the thin film by a thermochemical reaction,
- wherein a flow rate ratio of the nitrogen oxide-based gas to the fluorine-based gas is set to be a first flow rate ratio in the removing of the deposit including the thin film, a flow rate ratio of the nitrogen oxide-based gas to the fluorine-based gas is set to be a second flow rate ratio in the removing of the extraneous materials, and the second flow rate ratio is smaller than the first flow rate ratio.

* * * * *